(12) United States Patent
Kobayashi et al.

(10) Patent No.: US 9,734,993 B2
(45) Date of Patent: Aug. 15, 2017

(54) SEMICONDUCTOR MANUFACTURING APPARATUS

(75) Inventors: Atsushi Kobayashi, Miyagi (JP); Kazuyuki Miura, Miyagi (JP); Akira Yasumuro, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 560 days.

(21) Appl. No.: 13/528,504

(22) Filed: Jun. 20, 2012

(65) Prior Publication Data

US 2012/0325796 A1    Dec. 27, 2012

Related U.S. Application Data

(60) Provisional application No. 61/507,618, filed on Jul. 14, 2011.

(30) Foreign Application Priority Data

Jun. 21, 2011    (JP) .................. 2011-137506

(51) Int. Cl.
  *F27D 11/00*    (2006.01)
  *H01J 37/32*    (2006.01)

(52) U.S. Cl.
  CPC .. *H01J 37/32467* (2013.01); *H01J 37/32522* (2013.01); *H01J 37/32532* (2013.01)

(58) Field of Classification Search
  CPC ........... H01J 37/32467; H01J 37/32532; H01J 37/32522
  USPC ....... 219/209, 385, 536, 538, 552, 544, 553, 219/526, 638, 444.1, 443.1, 465.1, 400, 219/449, 121.6, 121.37, 121.36, 121.54, 219/121.52
  See application file for complete search history.

(56) References Cited

U.S. PATENT DOCUMENTS

| | | | |
|---|---|---|---|
| 2004/0018008 A1* | 1/2004 | Koren et al. .................. | 392/416 |
| 2007/0022954 A1* | 2/2007 | Iizuka et al. .................. | 118/724 |
| 2007/0227664 A1* | 10/2007 | Matsumoto et al. ..... | 156/345.47 |
| 2008/0248951 A1* | 10/2008 | Yoshitani et al. ............ | 503/227 |
| 2010/0209319 A1 | 8/2010 | Choi | |

FOREIGN PATENT DOCUMENTS

| | | |
|---|---|---|
| CN | 101047113 A | 10/2007 |
| CN | 101805924 A | 8/2010 |
| JP | 2000077402 A | 3/2000 |
| JP | 2000223423 A | 8/2000 |

(Continued)

*Primary Examiner* — Phuong Nguyen
(74) *Attorney, Agent, or Firm* — Brundidge & Stanger, P.C.

(57) ABSTRACT

A semiconductor manufacturing apparatus is capable of reducing power consumption. The semiconductor manufacturing apparatus 1 includes a processing chamber 2 that has a top surface 2a and forms a processing space S therein; a mounting table 3 provided in the processing space S; an upper electrode 20 provided above the mounting table 3 to face the mounting table 3; heaters 35 and 36 provided around the upper electrode 20 and below the top surface 2a of the processing chamber 2 and configured to heat the upper electrode 20; and a heat insulating unit 50, mounted on the top surface 2a of the processing chamber 2, having a plate-shaped member 51 and a heat insulating member 52 that is provided on one main surface 51a of the plate-shaped member 51.

13 Claims, 16 Drawing Sheets

(56) References Cited

FOREIGN PATENT DOCUMENTS

| JP | 2000235886 A | 8/2000 |
|----|--------------|--------|
| JP | 2002261083 A | 9/2002 |
| JP | 2006-286733  | 10/2006 |
| JP | 2007073865 A | 3/2007 |
| JP | 2009194297 A | 8/2009 |

* cited by examiner

FIG. 7

|  | SURFACE TEMPERATURE (°C) | TEMPERATURE DIFFERENCE FROM COMPARATIVE EXAMPLE (°C) |
|---|---|---|
| COMPARATIVE EXAMPLE | 82.3 | — |
| EXPERIMENTAL EXAMPLE 1 | 46.3 | -36.0 |
| EXPERIMENTAL EXAMPLE 2 | 66.3 | -16.0 |
| EXPERIMENTAL EXAMPLE 3 | 70.2 | -12.1 |
| EXPERIMENTAL EXAMPLE 4 | 70.1 | -12.2 |
| EXPERIMENTAL EXAMPLE 5 | 74.6 | -7.7 |

FIG. 8

|  | Reference | HEAT INSULATING MEMBER OF 10 mm | HEAT INSULATING MEMBER OF 20 mm |
|---|---|---|---|
| DURING TEMPERATURE RISE | 2728W | 2696W | 2740W |
|  |  | -32W | +12W |
|  |  | -1.2% | +0.4% |
| DURING IDLE TIME | 1972W | 1864W | 1832W |
|  |  | -108W | -140W |
|  |  | -5.5% | -7.1% |
| DURING PROCESS TRANSFER | 1800W | 1772W | 1780W |
|  |  | -28W | -20W |
|  |  | -1.6% | -1.1% |

FIG. 11
(a)
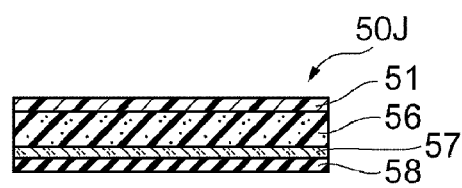
(b)
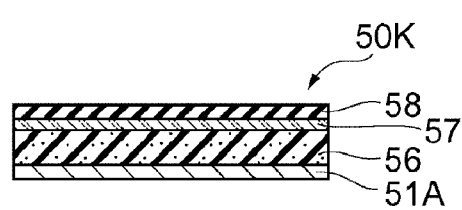
(c)
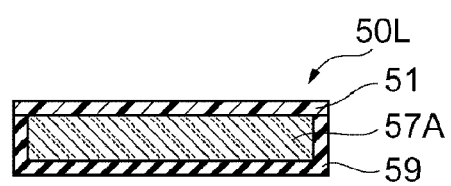
(d)
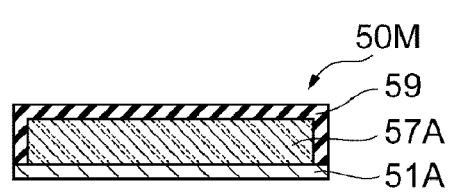

FIG. 12
(a)
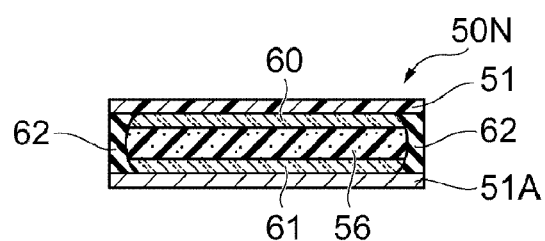
(b)
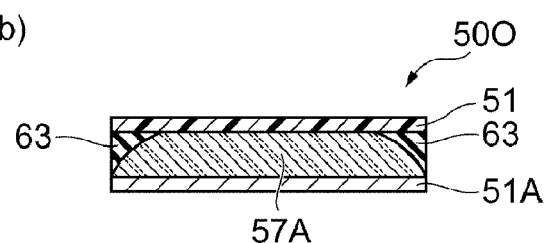
(c)
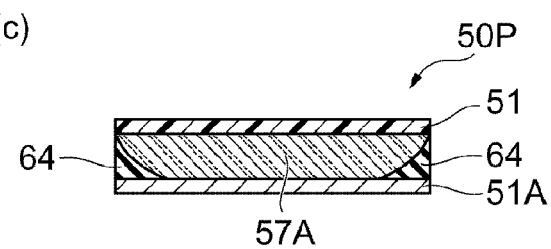

FIG. 13
(a)
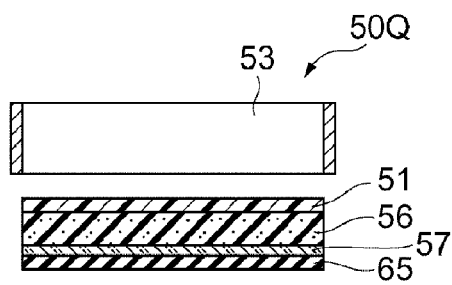
(b)
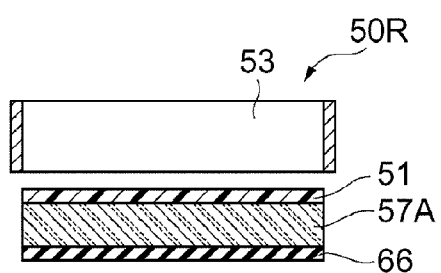
(c)
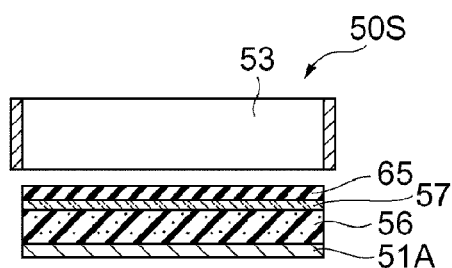
(d)
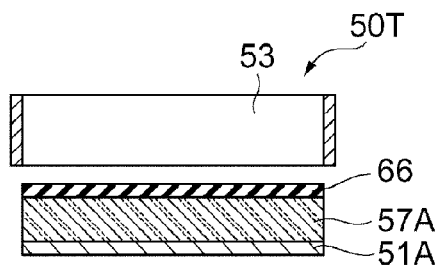

FIG. 14
(a) 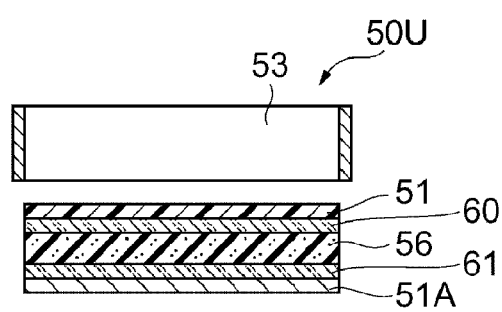
(b) 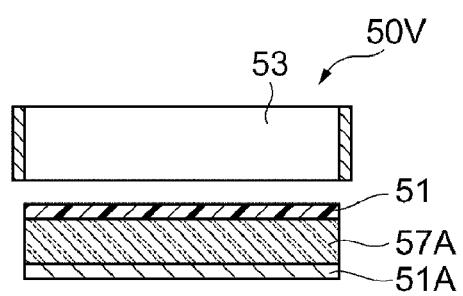
(c) 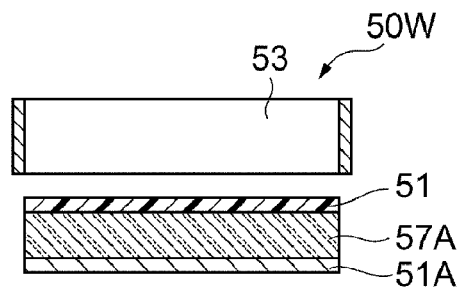

FIG. 15
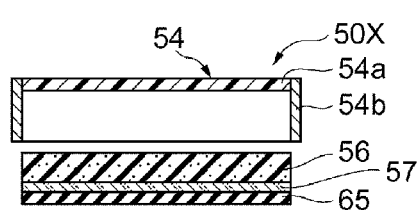
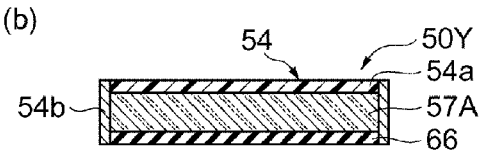
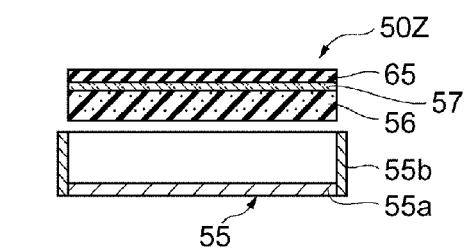
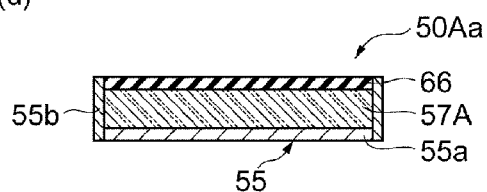
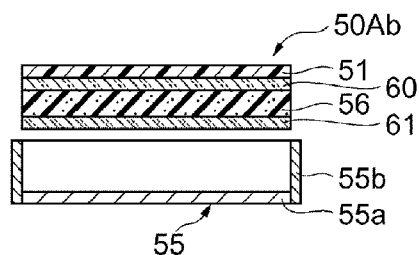

FIG. 16
(a)
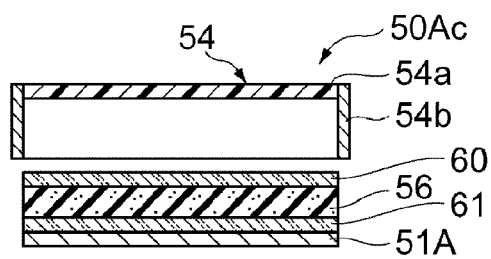
(b)
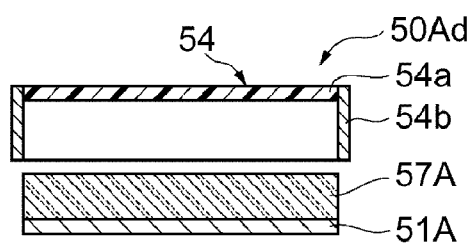
(c)
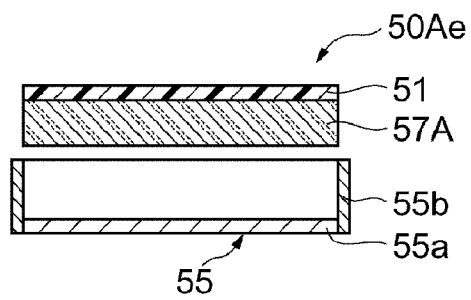

SEMICONDUCTOR MANUFACTURING APPARATUS

CROSS-REFERENCE TO RELATED APPLICATION

This application claims the benefit of Japanese Patent Application No. 2011-137506 filed on Jun. 21, 2011 and U.S. Provisional Application Ser. No. 61/507,618 filed on Jul. 14, 2011, the entire disclosures of which are incorporated herein by reference.

FIELD OF THE INVENTION

The present disclosure relates to a semiconductor manufacturing apparatus.

BACKGROUND OF THE INVENTION

As a conventional semiconductor manufacturing apparatus, there is known one described in Patent Document 1, for example. The semiconductor manufacturing apparatus described in Patent Document 1 includes a mounting table for mounting a semiconductor wafer thereon and a processing chamber having an upper electrode provided above the mounting table so as to face the mounting table in parallel thereto. Further, this semiconductor manufacturing apparatus also includes a high frequency power supply for applying a high frequency power to the mounting table and a processing gas supply unit for supplying a processing gas into the upper electrode. This semiconductor manufacturing apparatus is configured as a parallel plate plasma etching apparatus.

Patent Document 1: Japanese Patent Laid-open Publication No. 2006-286733

In the parallel plate semiconductor manufacturing apparatus having the aforementioned configuration, a heater for heating the upper electrode (the processing gas supplied into the upper electrode) may be provided in the vicinity of the upper electrode. In such a semiconductor manufacturing apparatus, it is required to reduce power consumption.

BRIEF SUMMARY OF THE INVENTION

In view of the foregoing, illustrative embodiments provide a semiconductor manufacturing apparatus capable of reducing power consumption.

In accordance with one aspect of an illustrative embodiment, there is provided a semiconductor manufacturing apparatus. The semiconductor manufacturing apparatus includes a processing chamber that has a top surface and forms a processing space therein; a mounting table provided in the processing space; an upper electrode provided above the mounting table to face the mounting table; a heater provided around the upper electrode and below the top surface of the processing chamber and configured to heat the upper electrode; and a heat insulating unit mounted on the top surface of the processing chamber. The heat insulating unit includes a plate-shaped member and a heat insulating member that is provided on one main surface of the plate-shaped member.

In this semiconductor manufacturing apparatus, the heat insulating unit is provided on the top surface of the processing chamber. Accordingly, a heat insulating effect can be improved by the heat insulating member of the heat insulating unit. Especially, it is possible to suppress heat radiation from a top portion of the processing chamber where a large amount of heat would otherwise be radiated. Accordingly, thermal efficiency can be improved, and, thus, power consumption can be reduced.

In the illustrative embodiment, the heat insulating member may be a foamed insulating member. By using the foamed insulating member, heat radiation can be effectively suppressed.

In the illustrative embodiment, the heat insulating unit may include a multiple number of segments that can be separated in a direction parallel with the top surface, and each segment may have the plate-shaped member and the heat insulating member. With this configuration, even if a pipe line or the like is connected to the top surface of the processing chamber, the heat insulating unit can be easily mounted on the top surface of the processing chamber with improved workability.

In the illustrative embodiment, the plate-shaped member may have rigidity higher than that of the heat insulating member. With this configuration, even when the heat insulating member is flexible, the heat insulating member can be prevented from being deformed when it is mounted on the top surface of the processing chamber or being bent while it is being mounted. Accordingly, manipulability of the heat insulating unit can be improved.

In the illustrative embodiment, a peripheral surface of the heat insulating member may be coated with a resin. With this configuration, it is possible to prevent dirt or dust from being generated from the heat insulating member can be suppressed.

In accordance with the illustrative embodiment, by suppressing heat radiation from the processing chamber, thermal efficiency can be improved and power consumption can be reduced.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 7 is a table showing a test result of heat insulating effect;

FIG. 8 is a table showing a test result of power consumption;

FIG. 11 is a diagram illustrating other types of heat insulating units;

FIG. 12 is a diagram illustrating other types of heat insulating units;

FIG. 13 is a diagram illustrating other types of heat insulating units;

FIG. 14 is a diagram illustrating other types of heat insulating units;

FIG. 15 is a diagram illustrating other types of heat insulating units; and

FIG. 16 is a diagram illustrating other types of heat insulating units.

DETAILED DESCRIPTION OF THE INVENTION

Figure 1:
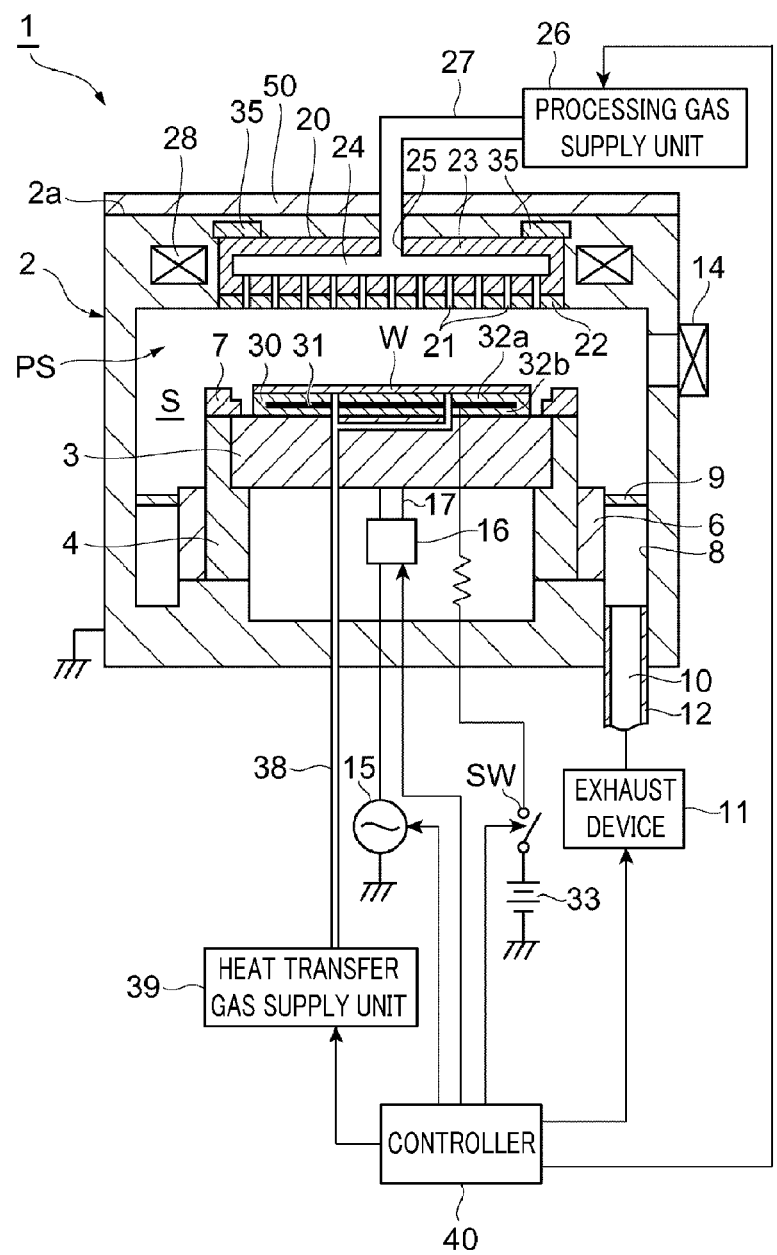
FIG. 1 is a cross sectional view schematically illustrating a plasma processing apparatus in accordance with an illustrative embodiment.

Hereinafter, illustrative embodiments will be described in detail with reference to the accompanying drawings. Through the drawings, same or corresponding parts will be assigned like reference numerals, and redundant description will be omitted.

[Plasma Processing Apparatus]

FIG. 1 is a cross sectional view schematically illustrating a plasma processing apparatus in accordance with an illustrative embodiment. The plasma processing apparatus 1 shown in FIG. 1 is configured as a parallel plate plasma etching apparatus. The plasma processing apparatus 1 includes a cylindrical chamber (processing vessel) 2 that forms a processing space S therein. The chamber 2 has a top surface 2a.

A circular plate-shaped mounting table 3 for mounting thereon, e.g., a semiconductor wafer as a processing target substrate is provided in the processing space S of the chamber 2 so as to serve as a lower electrode or a susceptor. The mounting table 3 is made of, but not limited to, aluminum. The mounting table 3 is supported by a cylindrical supporting member 6 vertically extended from a bottom of the chamber 2 via an insulating cylindrical holder 4. A focus ring 7 made of, e.g., quartz is provided on a top surface of the cylindrical holder 4 so as to surround a top surface of the mounting table 3 in a ring shape.

An exhaust path 8 is formed between a sidewall of the chamber 2 and the cylindrical supporting member 6. A baffle plate 9 is provided at an inlet of the exhaust path 8 or on the way of the exhaust path 8, and an exhaust port 10 is provided at a bottom portion of the exhaust path 8. An exhaust device 11 is connected to the exhaust port 10 via an exhaust pipe 12. The exhaust device 11 has a vacuum pump and is capable of depressurizing the processing space S within the chamber 2 to a certain vacuum level. A gate valve 14 for opening and closing a loading/unloading port through which the semiconductor wafer W is loaded or unloaded is provided at the sidewall of the chamber 2.

A high frequency power supply 15 for plasma generation is electrically connected to the mounting table 3 via a matching device 16 and a power supply rod 17. The high frequency power supply 15 applies a high frequency power of a certain frequency (equal to or higher than, e.g., about 27 MHz) to the lower electrode, i.e., to the mounting table 3. A shower head 20 serving as an upper electrode of a ground potential is provided at a top portion of the chamber 2 to face the mounting table 3 in parallel. A high frequency electric field is formed in a space between the mounting table 3 and the shower head 20, i.e., in a plasma generation space PS by applying a high frequency power from the high frequency power supply 15.

The shower head 20 includes an electrode plate 22 having a multiple number of gas through holes 21; and an electrode supporting member 23 for supporting the electrode plate 22 that is detachably fastened thereto. A buffer room 24 is formed within the electrode supporting member 23, and a gas supply pipe 27 from a processing gas supply unit 26 is connected to a gas inlet 25 of the buffer room 24.

A magnetic field forming device 28 is annularly or concentrically extended and provided above the periphery of the plasma generation space PS (around the shower head 20). The magnetic field forming device 28 serves to facilitate the starting of a high frequency electric discharge (plasma ignition) in the plasma generation space PS to maintain the high frequency electric discharge stably.

An electrostatic chuck 30 for attracting and holding the semiconductor wafer W by an electrostatic attracting force is provided on the top surface of the mounting table 3. The electrostatic chuck 30 includes an electrode 31 made of a conductive film and a pair of insulating films 32a and 32b. The electrode 32 is interposed between the insulation films 32a and 32b. The electrode 31 is electrically connected with a DC power supply 33 via a switch SW. The semiconductor wafer W is attracted to and held on the electrostatic chuck 30 by a Coulomb force generated by a DC voltage applied from the DC power supply 33.

A first heater 35 is provided above the shower head 20 (near the shower head 20 and under the top surface 2a). The first heater 35 is a heat source for heating the shower head 20 (for controlling the temperature of the electrode plate 22) and has a ring shape. An outer diameter of the first heater 35 is larger than an outer diameter of the shower head 20.

Figure 2:
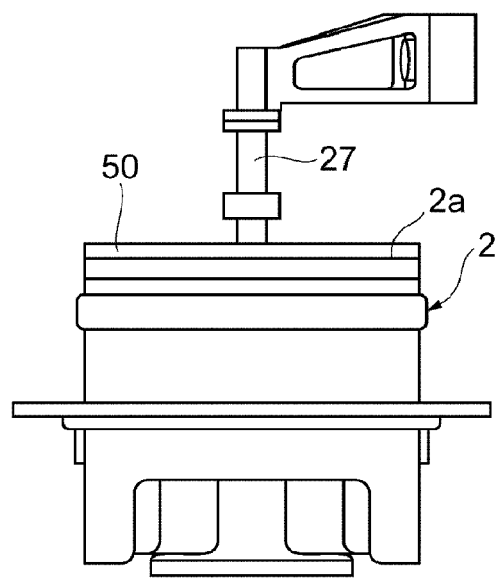
FIG. 2 is a perspective view schematically illustrating a chamber.
Figure 3:
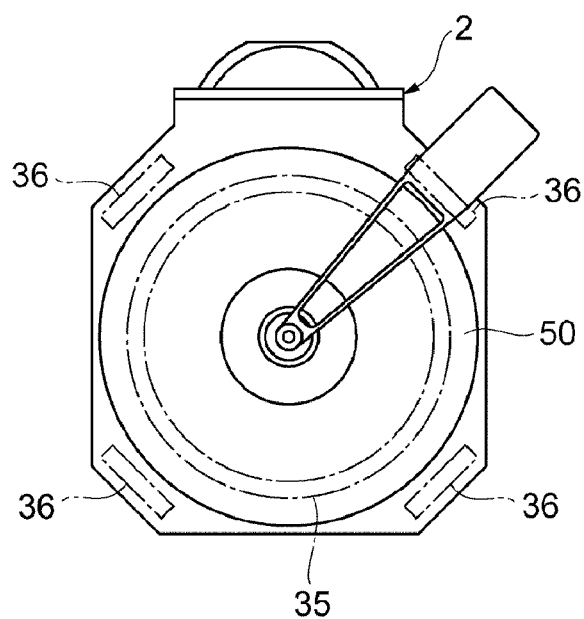
FIG. 3 is a top view of the chamber shown in FIG. 2.

FIG. 2 is a perspective view schematically illustrating the chamber, and FIG. 3 is a top view of the chamber shown in FIG. 2. As depicted in FIG. 3, a multiple number of (here, four) second heaters 36 are provided in the chamber 2. The second heaters 36 are heat sources for heating the shower head 20 and are arranged at the sidewall of the chamber 2 so as to be positioned outside the first heater 35 in a diametrical direction.

Further, a heat transfer gas supply unit 39 is connected to the mounting table 3 via a gas supply line 38. The heat transfer gas supply unit 39 supplies a heat transfer gas (e.g., a He gas) between a top surface of the electrostatic chuck 30 and a rear surface of the semiconductor wafer W. A controller 40 controls individual components of plasma processing apparatus 1 and performs an overall control of the entire processing sequence.

[Heat Insulating Unit]

Figure 4:
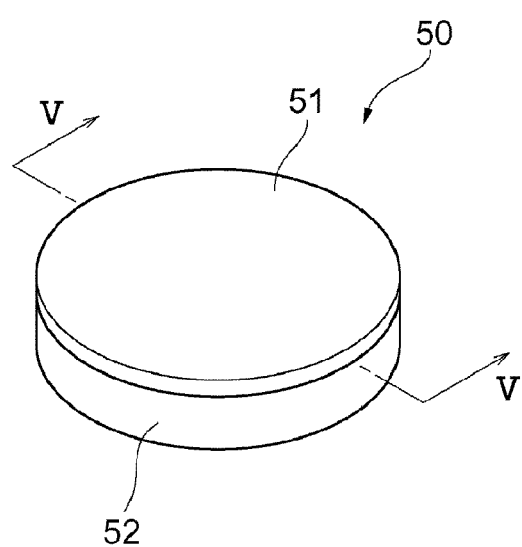
FIG. 4 is a perspective view illustrating a heat insulating unit.
Figure 5:
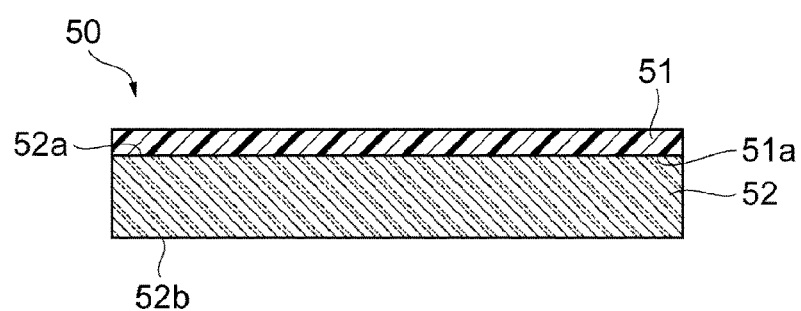
FIG. 5 is a cross sectional view taken along a line V-V of FIG. 4.

As depicted in FIGS. 1 and 2, a heat insulating unit 50 is provided (mounted) on the top surface 2a of the chamber 2. FIG. 4 is a perspective view of the heat insulating member and FIG. 5 is a cross sectional view taken along a line V-V of FIG. 4. As illustrated in FIGS. 4 and 5, the heat insulating unit 50 includes a plate-shaped member 51 and a heat insulating member 52. The plate-shaped member 51 is made of, but not limited to, an acrylic resin and has a circular plate shape (corresponding to the shape of the top surface 2a of the chamber 2). The plate-shaped member 51 has a thickness of about several mm and has rigidity higher than that of the heat insulating member 52 to be described below. The plate-shaped member 51 may be made of a metal.

The heat insulating member 52 is, for example, a foamed insulating member (product name: Aeroflex (registered trademark) and has a circular plate shape (corresponding to the shape of the top surface 2a of the chamber 2). The heat insulating member 52 has a thickness of, e.g., about 10 mm. One main surface 52a of the heat insulating member 52 is bonded to one main surface 51a of the plate-shaped member 51 by, e.g., an adhesive. The heat insulating member 52 is brought into contact with the top surface 2a of the chamber 2. That is, the heat insulating unit 50 is placed on the top surface 2a of the chamber 2 such that the other main surface 52b of the heat insulating member 52 is in contact with the top surface 2a of the chamber 2. Further, the heat insulating member 52 may be a member in which a heat insulating material is plated or thermally sprayed on a metal, besides the foamed insulating member.

Figure 6:
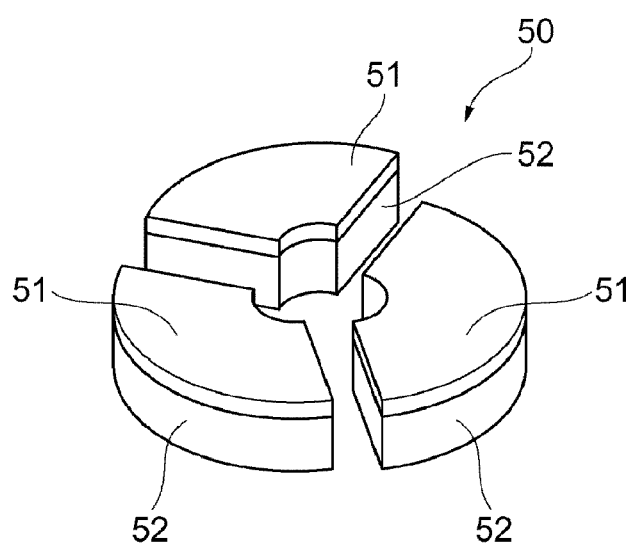
FIG. 6 is a perspective view illustrating a state in which the heat insulating unit is divided.
Figure 9:
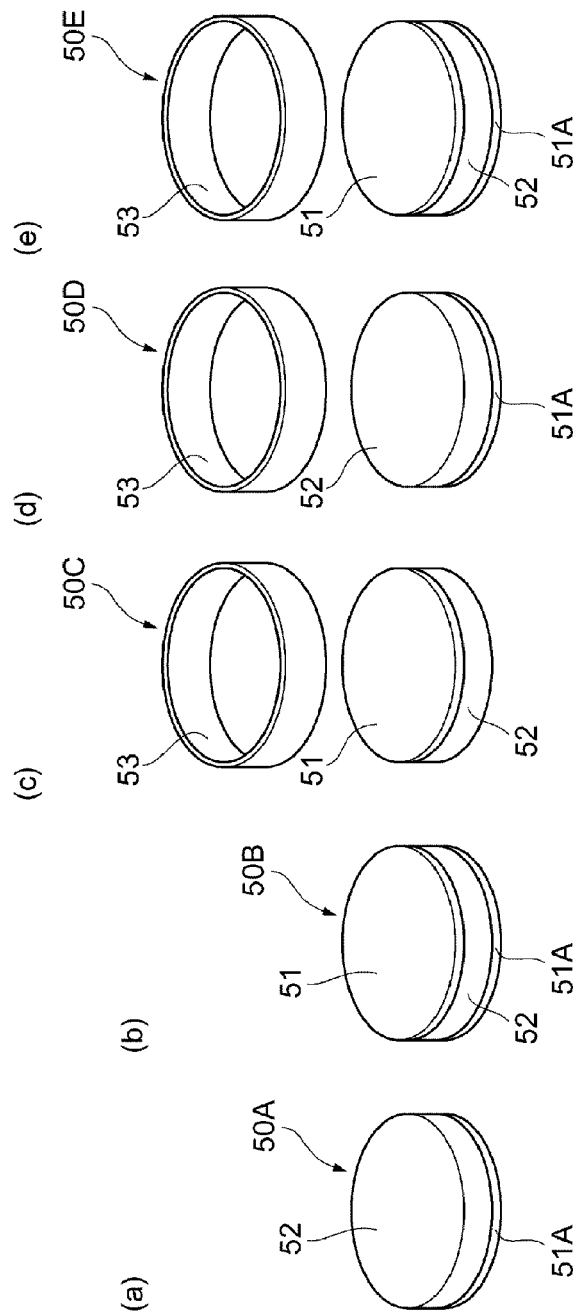
FIG. 9 is a diagram illustrating other types of heat insulating units.
Figure 10:
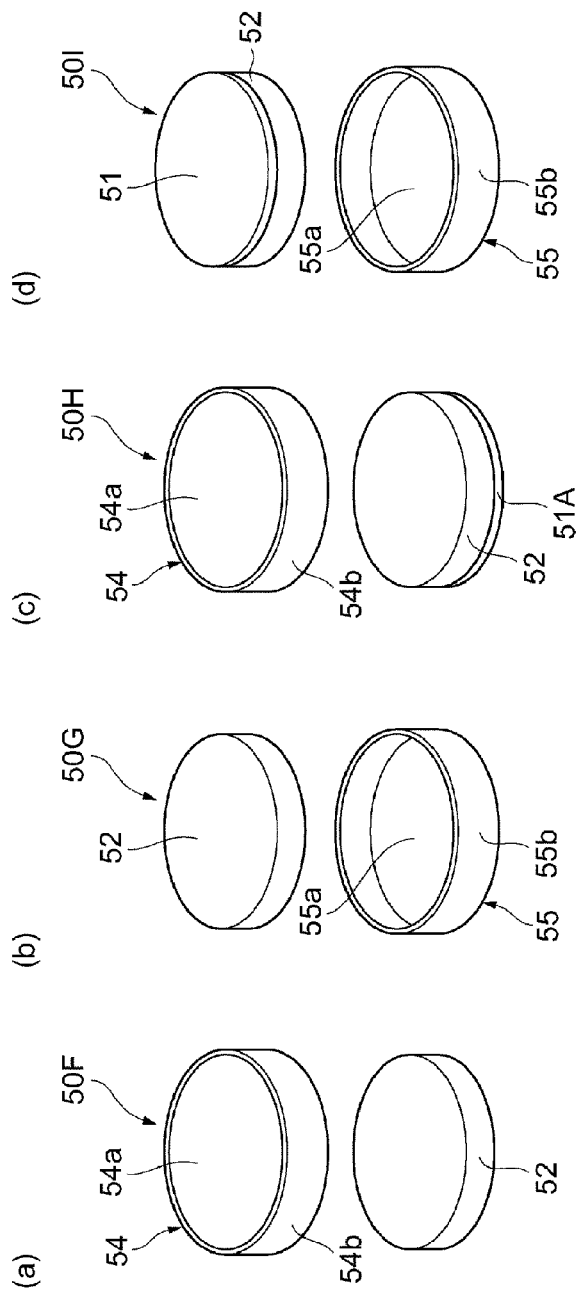
FIG. 10 is a diagram illustrating other types of heat insulating units.

The heat insulating unit 50 having the above-described configuration can be divided into plural segments. As depicted in FIG. 6, the heat insulating unit 50 is divided into plural (here, three) segments. Here, each segment has the plate-shaped member 51 and the heat insulating member 52 as one body. The segments are separated in a direction parallel to the top surface 2a of the chamber 2 (i.e., in a plane direction of the top surface 2a). To elaborate, for example, the heat insulating unit 50 has an opening at a position corresponding to the gas supply pipe 27 connected to the top portion of the chamber 2, and the gas supply pipe 27 is inserted through this opening while being surrounded by the plural segments of the heat insulating unit 50. The number of the segments of the heat insulating unit 50 and the shape of each segment may be set according to the shape of the chamber 2 or the like.

As stated above, in accordance with the present illustrative embodiment, the heat insulating unit 50 is disposed on the top surface 2a of the chamber 2 in the plasma processing apparatus 1. The heat insulating unit 50 includes the plate-shaped member 51 and the heat insulating member 52. The heat insulating member 52 suppresses heat radiation (by insulating heat), so that thermal efficiency of the chamber 2 can be improved. Especially, since the heat insulating unit 50 is provided on the top surface 2a of the chamber 2 where a larger amount of heat would be radiated, heat radiation can be efficiently suppressed.

Further, the plate-shaped member 51 having higher rigidity than that of the heat insulating member 52 is provided. Thus, even when the heat insulating member 52 is flexible, deformation or bending of the heat insulating member 52 can be prevented. As a consequence, manipulability can be improved.

Moreover, the heat insulating unit 50 includes the plural segments that can be separated in the direction parallel to the top surface 2a, and each segment has the aforementioned structure including the plate-shaped member 51 and the heat insulating member 52 (see FIG. 6). Accordingly, when providing the heat insulating unit 50, the segments can be individually mounted on the top surface 2a of the chamber 2. Thus, workability can be improved.

In addition, since the heat insulating unit 50 is mounted on the top surface 2a of the chamber 2, it is applicable to the conventional semiconductor manufacturing apparatuses. Further, since the heat insulating unit 50 has a simple structure with the plate-shaped member 51 and the heat insulating member 52, it is possible to reduce the cost.

The heat insulating effect (heat radiation suppressing effect) of the heat insulating unit 50 will be discussed with reference to FIG. 7. FIG. 7 is a table showing a test result of the heat insulating effect. As depicted in FIG. 7, as heat insulating units, there are prepared:
(1) an alumite-treated metal plate (Comparative example)
(2) a metal plate to which Aeroflex (Registered trademark) which is a foamed insulating member, is bonded (Experimental example 1)
(3) a metal plate whose surface is coated with silicone rubber (Experimental example 2)
(4) a metal plate whose surface is coated with a ceramic coat [SE250], a special insulating coating material (produced by Telenix Co., Ltd., Japan) (Experimental example 3)
(5) a metal plate whose surface is thermally sprayed with a heat insulating porous material (Product name: Insulating Porous, produced by Tocalo Co., Ltd.) (Experimental example 4)
(6) a metal plate whose surface is coated with Hy-Coat (Product name: Hy-Coat (mainly made of fluorine resin), produced by Tocalo Co., Ltd) (Experimental example 5)

The comparative example and the experimental examples 1 to 5 are simultaneously heated on a hot plate (about 140° C.) Then, surface temperatures of the respective examples are measured, and temperature differences between each of the experimental examples 1 to 5 and the comparative example are calculated. Each surface temperature is an average temperature after the surface temperature of the comparative example reaches 80° C.

As can be seen from FIG. 7, the experimental example 1 shows the largest temperature difference from the comparative example, and the average temperature difference is about ⌈−36.0° C.⌉. Further, the average temperature difference is about ⌈−16.0⌉ in the experimental example 2; about ⌈−12.1° C.⌉ in the experimental example 3; about ⌈−12.2° C.⌉ in the experimental example 4; and about ⌈−7.7° C.⌉ in the experimental example 5. From this result, it is found out that all of the experimental examples 1 to 5 exhibit higher heat insulating effect than that of the comparative example.

Now, a power consumption reducing effect by the heat insulating unit 50 will be discussed with reference to FIG. 8. FIG. 8 is a table showing a test result of power consumption. In this test, current values of the first heater 35 at the top portion of the chamber 2 and the second heater 36 at the sidewall of the chamber 2 are measured, and power consumptions during a temperature rise, an idle time and a process transfer are calculated. Aeroflex having thicknesses of about 10 mm and 20 mm are used as heat insulating members. As for power consumption, the first heater 35 has a rated power of about 1400 W and the second heater 36 has a rated power of about 2080 W.

As shown in FIG. 8, during the temperature rise, as compared to an actual power consumption measurement value of about 2728 W when a heat insulating member is not used, a power consumption when using the heat insulating member of about 10 mm is reduced by about 1.2% (⌈−1.2%⌉) and a power consumption when using the heat insulating member of about 20 mm is increased by about 0.4% (⌈+0.40⌉). During the idle time, as compared to an actual power consumption measurement value of about 1972 W when a heat insulating member is not used, a power consumption when using the heat insulating member of about 10 mm is reduced by about 5.5% (⌈−5.5%⌉) and a power consumption when using the heat insulating member of about 20 mm is reduced by about 7.1% (⌈−7.1%⌉). Further, during the process transfer, as compared to an actual power consumption measurement value of about 1800 W, a power consumption when using the heat insulating member of about 10 mm is reduced by about 1.6% (⌈−1.6%⌉) and a power consumption when using the heat insulating member of about 20 mm is reduced by about 1.1% (⌈−1.1%⌉).

From the above result, it is found out that by providing the heat insulating unit 50 (heat insulating member 52) on the top surface 2a of the chamber 2, heat radiation from the chamber 2 can be suppressed, so that thermal efficiency can be improved. As a result, power consumption can be reduced. When the heat insulating member of about 20 mm is used, although the power consumption is found to be slightly increased during the temperature rise, a state during the temperature rise tends to be instable. Hence, such a result may be considered to be within an error range.

[Other Types of Heat Insulating Units]

Hereinafter, other types of heat insulating units will be described with reference to FIGS. 9(a) to 16(c). Heat insulating units to be described below may be separated into plural segments, the same as the aforementioned heat insulating unit 50.

Referring to FIG. 9(a), a heat insulating unit 50A includes a plate-shaped member 51A and a heat insulating member 52. The plate-shaped member 51A is made of a metal and is in contact with the top surface 2a of the chamber 2. That is, the heat insulating unit 50A is placed on the top surface 2a of the chamber 2 with the plate-shaped member 51A facing downward.

Referring to FIG. 9(b), a heat insulating unit 50B includes a plate-shaped member 51, a heat insulating member 52 and a plate-shaped member 51A. In the heat insulating unit 50B, the heat insulating member 52 is disposed between the plate-shaped member 51 and the plate-shaped member 51A. The heat insulating unit 50B is placed on the top surface 2a of the chamber 2 with the plate-shaped member 51A facing downward.

Referring to FIG. 9(c), a heat insulating unit 50C includes a plate-shaped member 51, a heat insulating member 52 and a frame member 53. The frame member 53 is made of, but not limited to, a metal or an acrylic resin, and covers peripheral surfaces of the plate-shaped member 51 and the heat insulating member 52. The heat insulating unit 50C is placed on the top surface 2a of the chamber 2 with the heat insulating member 52 facing downward. In this heat insulating unit 50C, by providing the frame member 53, it is possible to prevent dirt or dust from being generated from the peripheral surface of the heat insulating member 52.

Referring to FIG. 9(d), a heat insulating unit 50D includes a plate-shaped member 51A, a heat insulating member 52 and a frame member 53. The heat insulating unit 50D is placed on the top surface 2a of the chamber 2 with the plate-shaped member 51A facing downward.

Referring to FIG. 9(e), a heat insulating unit 50E includes a plate-shaped member 51, a heat insulating member 52, a plate-shaped member 51A and a frame member 53. The heat insulating unit 50E is placed on the top surface 2a of the chamber 2 with the plate-shaped member 51A facing downward.

Referring to FIG. 10(a), a heat insulating unit 50F includes a heat insulating member 52 and a frame unit 54. The frame unit 54 includes a circular plate-shaped member 54a made of, e.g., a metal or an acrylic resin, and a ring-shaped frame member 54b that covers a peripheral surface of the plate-shaped member 54a. The plate-shaped member 54a and the frame member 54b are formed as a single body. The frame unit 54 is provided to the heat insulating member 52 such that a peripheral surface of the heat insulating member 52 is enclosed by the frame member 54b. The heat insulating unit 50F is placed on the top surface 2a of the chamber 2 with the heat insulating member 52 facing downward. In this heat insulating unit 50F, by providing the frame unit 54, it is possible to prevent dirt or dust from being generated from the peripheral surface of the heat insulating member 52.

Referring to FIG. 10(b), a heat insulating unit 50G includes a heat insulating member 52 and a frame unit 55. The frame unit 55 includes a circular plate-shaped member 55a made of a metal and a ring-shaped frame member 55b that covers a peripheral surface of the plate-shaped member 55a. The plate-shaped member 55a and the frame member 55b are formed as a single body. The heat insulating unit 50G is placed on the top surface 2a of the chamber 2 with the frame unit 55 facing downward. In the heat insulating unit 50G, by providing the frame unit 55, it is possible to prevent dirt or dust from being generated from a peripheral surface of the heat insulating member 52.

Referring to FIG. 10(c), a heat insulating unit 50H includes a plate-shaped member 51A, a heat insulating member 52 and a frame unit 54. The frame unit 54 is provided to the heat insulating member 52 such that a peripheral surface of the heat insulating member 52 is enclosed by a frame member 54b. The heat insulating unit 50H is placed on the top surface 2a of the chamber 2 with the plate-shaped member 51A facing downward.

Referring to FIG. 10(d), a heat insulating unit 50I includes a plate-shaped member 51, a heat insulating member 52 and a frame unit 55. The frame unit 55 is provided to the heat insulating member 52 such that a peripheral surface of the heat insulating member 52 is enclosed by a frame member 55b. The heat insulating unit 50I is placed on the top surface 2a of the chamber 2 with the frame unit 55 facing downward.

Referring to FIG. 11(a), a heat insulating unit 50J includes a plate-shaped member 51, a metallic member 56, a heat insulating member 57 and a coating member 58. The heat insulating member 57 is formed by coating or thermally spraying a heat insulating coating material on the metallic member 56. The coating member 58 is prepared by plating a coating material (resin) such as the Hy-Coat having heat resistance on the top surface of the heat insulating member 57. The heat insulating unit 50J is placed on the top surface 2a of the chamber 2 with the coating member 58 facing downward.

Referring to FIG. 11(b), a heat insulating unit 50K includes a plate-shaped member 51A, a metallic member 56, a heat insulating member 57 and a coating member 58. The heat insulating unit 50K is placed on the top surface 2a of the chamber 2 with the plate-shaped member 51A facing downward.

Referring to FIG. 11(c), a heat insulating unit 50L includes a plate-shaped member 51, a heat insulating member 57A and a coating member 59. The heat insulating member 57A is formed by plating or thermally spraying a heat insulating coating material on the plate-shaped member 51. The coating member 59 is formed so as to cover a top surface and a peripheral surface of the heat insulating member 57A. The heat insulating unit 50L is placed on the top surface 2a of the chamber 2 with the coating member 59 facing downward. In the heat insulating unit 50L, by providing the coating member 59, it is possible to prevent dirt or dust from being generated from the peripheral surface of the heat insulating member 57A.

Referring to FIG. 11(d), a heat insulating unit 50M includes a plate-shaped member 51A, a heat insulating member 57A and a coating member 59. The heat insulating member 57A is formed by plating or thermally spraying a heat insulating coating material on the plate-shaped member 51A. The heat insulating unit 50M is placed on the top surface 2a of the chamber 2 with the plate-shaped member 51A facing downward.

Referring to FIG. 12(a), a heat insulating unit 50N includes a plate-shaped member 51, a plate-shaped member 51A, metallic member 56, a first heat insulating member 60, a second heat insulating member 61 and a coating member 62. The first heat insulating member 60 is formed by plating or thermally spraying a heat insulating coating material on the entire of one main surface of the metallic member 56. The second heat insulating member 61 is formed by plating or thermally spraying a heat insulating coating material on the entire of the other main surface of the metallic member 56. The coating member 62 is formed so as to cover peripheral surfaces of the first heat insulating member 60, the second heat insulating member 61 and metallic member 56. The metallic member 56 provided with the first heat insulating member 60, the second heat insulating member 61 and the coating member 62 is interposed between the plate-shaped member 51 and the plate-shaped member 51A. The heat insulating unit 50N is placed on the top surface 2a of the chamber 2 with the plate-shaped member 51A facing downward. In this heat insulating unit 50N, by providing the coating member 62, it is possible to prevent dirt or dust from being generated from the peripheral surfaces of the first and second heat insulating members 60 and 61.

Referring to FIG. 12(b), a heat insulating unit 50O includes a plate-shaped member 51, a plate-shaped member 51A, a heat insulating member 57A and a coating member 63. The heat insulating member 57A is formed by plating or thermally spraying a heat insulating coating material on the plate-shaped member 51A. The coating member 63 is formed to cover a peripheral surface of the heat insulating member 57A. The heat insulating unit 50O is placed on the top surface 2a of the chamber 2 with the plate-shaped member 51A facing downward. In this heat insulating unit 50O, by providing the coating member 63, it is possible to prevent dirt or dust from being generated from the peripheral surface of the heat insulating member 57A.

Referring to FIG. 12(c), a heat insulating unit 50P includes a plate-shaped member 51, a plate-shaped member 51A, a heat insulating member 57A and a coating member 64. The heat insulating member 57A is formed by plating or thermally spraying a heat insulating coating material on the plate-shaped member 51. The coating member 64 is formed to cover a peripheral surface of the heat insulating member 57A. The heat insulating unit 50P is placed on the top surface 2a of the chamber 2 with the plate-shaped member 51A facing downward. In this heat insulating unit 50P, by providing the coating member 64, it is possible to prevent dirt or dust from being generated from the peripheral surface of the heat insulating member 57A.

Referring to FIG. 13(a), a heat insulating unit 50Q includes a plate-shaped member 51, a frame member 53, a metallic member 56, a heat insulating member 57 and a coating member 65. The coating member 65 is formed to cover a top surface of the metallic member 56. The heat insulating unit 50Q is placed on the top surface 2a of the chamber 2 with the coating member 65 facing downward.

Referring to FIG. 13(b), a heat insulating unit 50R includes a plate-shaped member 51, a frame member 53, a heat insulating member 57A and a coating member 66. The coating member 66 is formed to cover a top surface of the heat insulating member 57A. The heat insulating unit 50R is placed on the top surface 2a of the chamber 2 with the coating member 66 facing downward.

Referring to FIG. 13(c), a heat insulating unit 50S includes a plate-shaped member 51A, a frame member 53, a metallic member 56, a heat insulating member 57 and a coating member 65. The heat insulating unit 50S is placed on the top surface 2a of the chamber 2 with the plate-shaped member 51A facing downward.

Referring to FIG. 13(d), a heat insulating unit 50T includes a plate-shaped member 51A, a frame member 53, a heat insulating member 57A and a coating member 66. The heat insulating unit 50T is placed on the top surface 2a of the chamber 2 with the plate-shaped member 51A facing downward.

Referring to FIG. 14(a), a heat insulating unit 50U includes a plate-shaped member 51, a plate-shaped member 51A, a frame member 53, a metallic member 56, a first heat insulating member 60 and a second heat insulating member 61. The heat insulating unit 50U is placed on the top surface 2a of the chamber 2 with the plate-shaped member 51A facing downward.

Referring to FIG. 14(b), a heat insulating unit 50V includes a plate-shaped member 51, a plate-shaped member 51A, a frame member 53 and a heat insulating member 57A. The heat insulating member 57A is formed by plating or thermally spraying a heat insulating coating material on the plate-shaped member 51A. The heat insulating unit 50V is placed on the top surface 2a of the chamber 2 with the plate-shaped member 51A facing downward.

Referring to FIG. 14(c), a heat insulating unit 50W includes a plate-shaped member 51, a plate-shaped member 51A, a frame member 53 and a heat insulating member 57A. The heat insulating member 57A is formed by plating or thermally spraying a heat insulating coating material on the plate-shaped member 51. The heat insulating unit 50W is placed on the top surface 2a of the chamber 2 with the plate-shaped member 51A facing downward.

Referring to FIG. 15(a), a heat insulating unit 50 includes a frame unit 54, a metallic member 56, a heat insulating member 57 and a coating member 65. The heat insulating unit 50x is placed on the top surface 2a of the chamber 2 with the coating member 65 facing downward.

Referring to FIG. 15(b), a heat insulating unit 50Y includes a frame unit 54, a heat insulating member 57A and a coating member 66. The heat insulating member 57A is formed by plating or thermally spraying a heat insulating coating material on a plate-shaped member 54a of the frame unit 54. The heat insulating unit 50Y is placed on the top surface 2a of the chamber 2 with the coating member 66 facing downward.

Referring to FIG. 15(c), a heat insulating unit 50Z includes a frame unit 55, a metallic member 56, a heat insulating member 57 and a coating member 65. The heat insulating unit 50Z is placed on the top surface 2a of the chamber 2 with the frame unit 55 facing downward.

Referring to FIG. 15(d), a heat insulating unit 50Aa includes a frame unit 55, a heat insulating member 57A and a coating member 66. The heat insulating member 57A is formed by plating or thermally spraying a heat insulating coating material on a plate-shaped member 55a of the frame unit 55. The heat insulating unit 50Aa is placed on the top surface 2a of the chamber 2 with the frame unit 55 facing downward.

Referring to FIG. 15(e), a heat insulating unit 50Ab includes a plate-shaped member 51, a frame unit 55, a metallic member 56, a first heat insulating member 60 and a second heat insulating member 61. The heat insulating unit 50Ab is placed on the top surface 2a of the chamber 2 with the frame unit 55 facing downward.

Referring to FIG. 16(a), a heat insulating unit 50Ac includes a plate-shaped member 51A, a frame unit 54, a metallic member 56, a first heat insulating member 60 and a second heat insulating member 61. The heat insulating unit 50Ac is placed on the top surface 2a of the chamber 2 with the plate-shaped member 51A facing downward.

Referring to FIG. 16(b), a heat insulating unit 50Ad includes a plate-shaped member 51A and a heat insulating member 57A. The heat insulating member 57A is formed by plating or thermally spraying a heat insulating coating material on the plate-shaped member 51A. The heat insulating unit 50Ad is placed on the top surface 2a of the chamber 2 with the plate-shaped member 51A facing downward.

Referring to FIG. 16(c), a heat insulating unit 50Ae includes a plate-shaped member 51, a frame unit 55 and a heat insulating member 57A. The heat insulating member 57A is formed by plating or thermally spraying a heat insulating coating material on the plate-shaped member 51. The heat insulating unit 50Ae is placed on the top surface 2a of the chamber 2 with the frame unit 55 facing downward.

The illustrative embodiment disclosed herein is for the purpose of illustration and is not intended to be limiting. By way of example, the high frequency power supply 15 is connected to the mounting table 3 in the above-described illustrative embodiment. Alternatively, the high frequency power supply 15 may be connected to the shower head 20.

Further, in the above-described illustrative embodiment, although the heat insulating member 52 is made of a foamed insulating member, the heat insulating member 52 may be made of other materials.

Moreover, in the above illustrative embodiment, although the heat insulating unit 50 (plate-shaped member 51 and the heat insulating member 52) is described to have a circular shape, the shape of the heat insulating unit 50 may be set according to the shape of the top surface 2a of the chamber 2. In addition, the heat insulating unit 50 may be designed to cover the entire top surface 2a of the chamber 2 or a portion thereof.

What is claimed is:

1. A plasma processing apparatus comprising:
   a processing chamber that includes a cylindrical side wall and an upper wall extended from the cylindrical side wall, wherein the processing chamber further includes a top surface and forms a processing space that is surrounded by the cylindrical side wall and positioned below the upper wall;
   a mounting table provided in the processing space;
   an upper electrode provided in the processing chamber and provided above the mounting table to face the mounting table;
   a heater provided around the upper electrode and below the top surface of the processing chamber and configured to heat the upper electrode; and
   a heat insulating unit mounted on the top surface of the processing chamber, the heat insulating unit being positioned outside of the processing chamber,
   wherein the heat insulating unit includes a plate-shaped member and a heat insulating member that is provided on one main surface of the plate-shaped member,
   wherein the heat insulating member is configured to suppress heat radiation from the processing chamber, and
   the plate-shaped member has rigidity higher than that of the heat insulating member.

2. The plasma processing apparatus of claim 1, wherein the heat insulating member is a foamed insulating member.

3. The plasma processing apparatus of claim 1, wherein the heat insulating unit includes a plurality of segments that being separated in a direction parallel with the top surface, and
   each segment has the plate-shaped member and the heat insulating member.

4. The plasma processing apparatus of claim 1, wherein a peripheral surface of the heat insulating member is coated with a resin.

5. The plasma processing apparatus of claim 1, further comprising:
   a matching device provided between the mounting table and a high frequency power supply.

6. The plasma processing apparatus of claim 1, further comprising:
   a DC power supply configured to apply a DC voltage to an electrostatic chuck provided on a top surface of the mounting table.

7. The plasma processing apparatus of claim 1, wherein the heat insulating unit contacts with an outside surface of the processing chamber.

8. The plasma processing apparatus of claim 1, wherein the heat insulating unit is mounted directly on the top surface of the processing chamber.

9. The plasma processing apparatus of claim 1, wherein a bottom surface of the heat insulating unit is directly contacted with the top surface of the processing chamber.

10. The plasma processing apparatus of claim 1, further comprising:
    a gas supply pipe connected to the top surface of the processing chamber,
    wherein the heat insulating unit is divided into plural segments,
    each of the plural segments has the plate-shaped member and the heat insulating member as one body, and
    the heat insulating unit has an opening at a position corresponding to the gas supply pipe.

11. The plasma processing apparatus of claim 1, wherein the plate-shaped member is made of an acrylic resin or a metal.

12. The plasma processing apparatus of claim 1, wherein the plate-shaped member has a first plate-shaped member and a second plate-shaped member, and
    the heat insulating member is placed between the first plate-shaped member and the second plate-shaped member.

13. The plasma processing apparatus of claim 1, wherein the heat insulating unit further includes a frame member that covers peripheral surfaces of the plate-shaped member and the heat insulating member.

* * * * *